US007866987B2

(12) United States Patent
Chen

(10) Patent No.: US 7,866,987 B2
(45) Date of Patent: Jan. 11, 2011

(54) BURN-IN TEST SOCKET HAVING SPRING-BIASED LATCHES FACILITATING ELECTRICAL INTERCONNECTION BETWEEN CHIPS AND SOCKET WHEN ACTUATED

(75) Inventor: Ming-Yue Chen, Tu-Cheng (TW)

(73) Assignee: Hon Hai Precision Ind.Co., Ltd., Taipei Hsien (TW)

( * ) Notice: Subject to any disclaimer, the term of this patent is extended or adjusted under 35 U.S.C. 154(b) by 0 days.

(21) Appl. No.: 12/702,335

(22) Filed: Feb. 9, 2010

(65) Prior Publication Data

US 2010/0216328 A1    Aug. 26, 2010

(30) Foreign Application Priority Data

Feb. 23, 2009    (TW) ............... 98202645 U

(51) Int. Cl.
*H01R 12/00* (2006.01)
(52) U.S. Cl. ........................ 439/73; 439/331
(58) Field of Classification Search ............ 439/73, 439/330, 331
See application file for complete search history.

(56) References Cited

U.S. PATENT DOCUMENTS

| 6,863,553 | B2 * | 3/2005 | Watanabe | ............... 439/331 |
| 7,121,858 | B2 | 10/2006 | Chen | |
| 7,278,868 | B2 * | 10/2007 | Sato et al. | ............... 439/331 |
| 7,393,232 | B2 * | 7/2008 | Morinari | ............... 439/331 |
| 7,666,016 | B2 * | 2/2010 | Kobayashi | ............... 439/331 |

* cited by examiner

*Primary Examiner*—Tho D Ta
(74) *Attorney, Agent, or Firm*—Andrew C. Cheng; Wei Te Chung; Ming Chieh Chang

(57) ABSTRACT

An electrical connector includes an insulative housing (1) defining a pair of guiding recesses (14), a connecting member (2) mounted in the insulative housing for connecting with a chip, a number of resilient members (4) received in the guiding recesses, a pair of latches (3) each having a pivot (34) mounted in the insulative housing and supported by the resilient members, and an actuator (3) mounted on the insulative housing and formed with a number of latching portions (63) in contact with the latch. The actuator is moveable along an up-to-down direction to drive the latch pivotable about the pivot between a locked position and an unlocked position.

17 Claims, 7 Drawing Sheets

BURN-IN TEST SOCKET HAVING SPRING-BIASED LATCHES FACILITATING ELECTRICAL INTERCONNECTION BETWEEN CHIPS AND SOCKET WHEN ACTUATED

BACKGROUND OF THE INVENTION

1. Field of the invention

The present invention relates to a burn-in test socket, and more particularly to a test socket having spring-biased latches facilitating electrical interconnection between chips and socket when actuated.

2. Description of Related Art

U.S. Pat. No. 7,121,858 issued to Chen on Oct. 17, 2006 discloses an electrical connector. The electrical connector comprises an insulative housing, a latch and an actuator mounted on the insulative housing, and a pair of springs mounted between the actuator and the insulative housing. The latch is formed with a locking portion and a pivot connected with the locking portion. The actuator is formed with a depressing portion resisting against the locking portion. When the actuator is pushed downwardly, the depressing portions depress the latch and upwardly opening the locking portions. The chip could be put into or pulled out from the insulative housing.

The latches do not receive a support from any supporting portions during the pivotable movement. Therefore, it is hard to realize a stable locking or unlocking operation.

Hence, an electrical connector formed with an improved latch is required to overcome the above-mentioned disadvantages of the related art.

SUMMARY OF THE INVENTION

An object of the present invention is to provide a burn-in test socket in which a spring-biased latch is incorporated so as to provide a reliable and robust electrical interconnection between a chip and the socket.

To achieve the aforementioned objects, an electrical connector includes an insulative housing defining a pair of guiding recess, a connecting member, a number of resilient members, a pair of latches, and an actuator. The connecting member is mounted in the insulative housing for connecting with a chip. The number of resilient members are received in the guiding recesses. Each latch has a pivot mounted in the insulative housing and supported by the resilient members. The actuator is mounted on the insulative housing and formed with a number of latching portions in contact with the latch. The actuator is moveable along an up-to-down direction to drive the latch pivotable about the pivot between a locked position and an unlocked position.

The latches are directly biased by a plurality of box springs in a way that a chip disposed on the socket can be effectively depressed toward contacts of the socket for reliable electrical interconnection therebetween.

Other objects, advantages and novel features of the invention will become more apparent from the following detailed description of a preferred embodiment when taken in conjunction with the accompanying drawings.

DETAILED DESCRIPTION OF THE INVENTION

Figure 1:
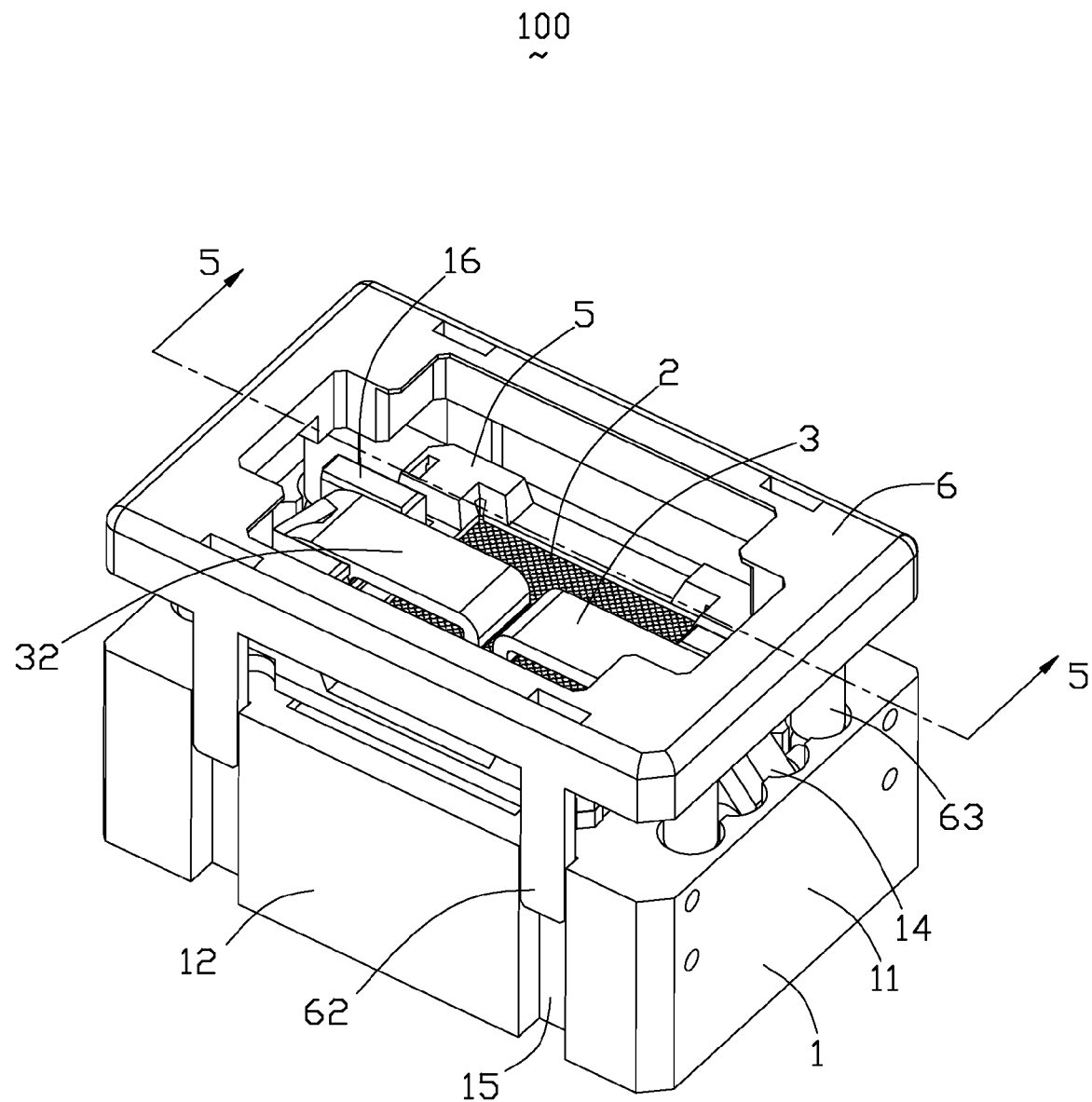
FIG. 1 is an assembled perspective view showing an electrical connector in accordance with the present invention, when the latching members are disposed in a locked position with springs fully extended.
Figure 2:
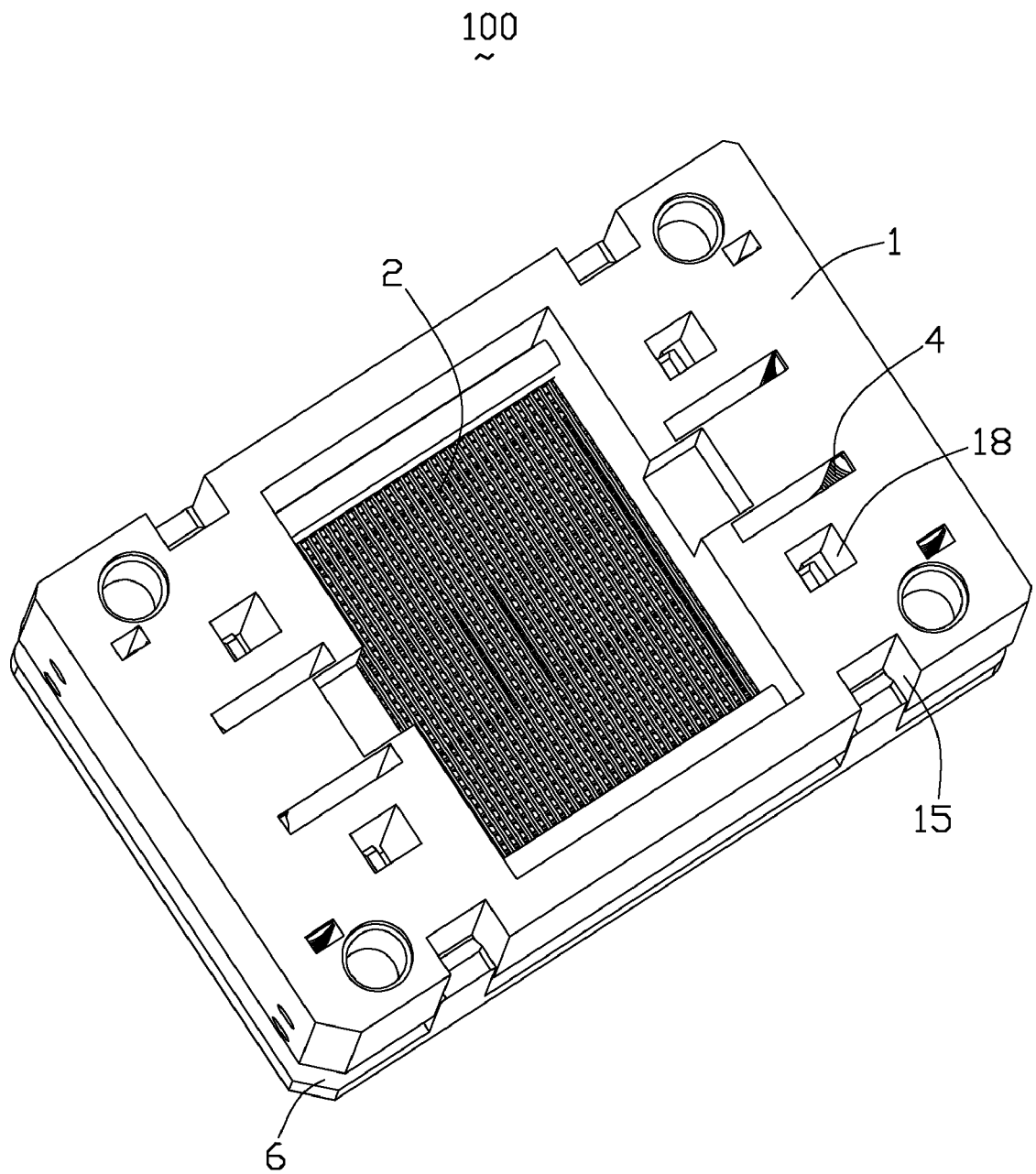
FIG. 2 is a view similar to FIG. 1, taken from another aspect.

Reference will now be made to the drawing figures to describe the present invention in detail. Referring to FIGS. 1-4, an electrical connector in accordance with the preferred embodiment of the present invention comprises an insulative housing 1 electrically connecting an chip (not shown), a connecting member 2, a plurality of springs 4, a plurality of stiffeners 7, a fixing member 5, a pair of latches 3 and an actuator 6 moveably mounted on the insulative housing 1.

Figure 3:
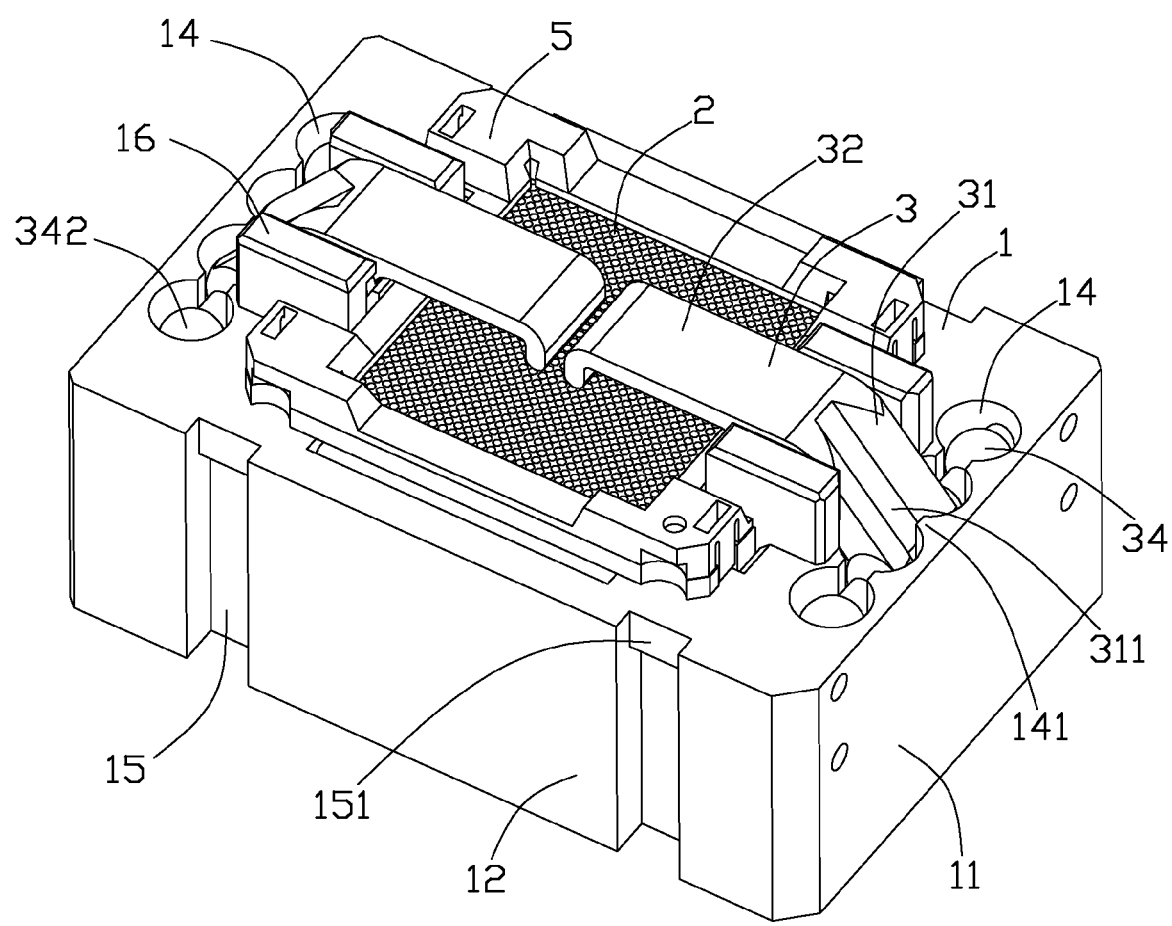
FIG. 3 is a perspective view of the electrical connector as shown in FIG. 1, with the actuator being removed.
Figure 4:
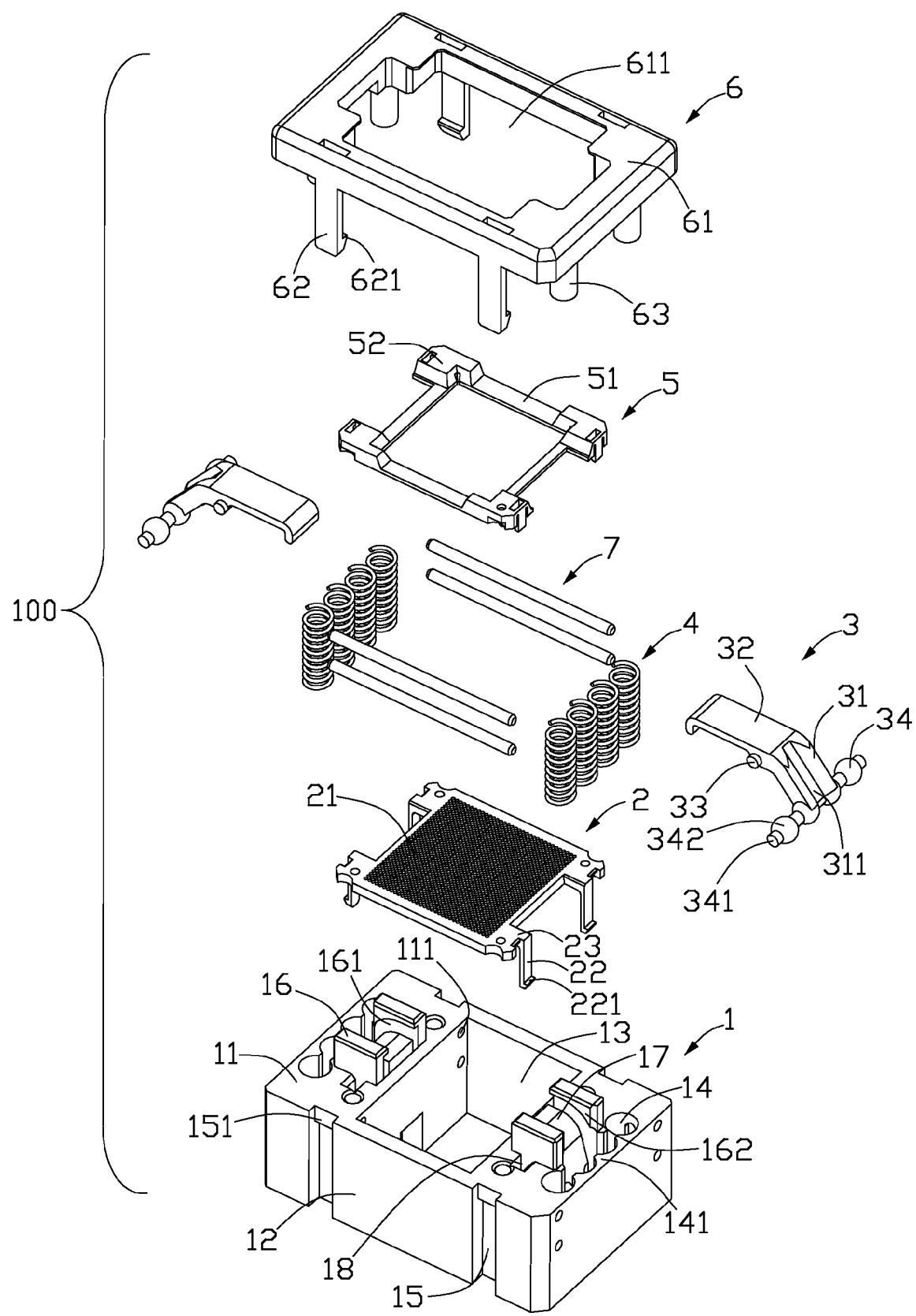
FIG. 4 is an exploded perspective view of the electrical connector as shown in FIG. 1.

Referring to FIGS. 3 and 4, the insulative housing 10 is formed into a rectangular cage and comprises a pair of primary walls 11, a pair of periphery walls 12 connected with the pair of primary walls 11, and a receiving space 13 defined therebetween. Each primary wall 11 is formed with a pair of supporting walls 16 and a platform 17 disposed between the pair of supporting walls 16. Each supporting wall 16 has an arcuate guiding groove 161 defined in an inner surface 162 thereof The primary wall 11 has a pair of inserting holes 18 defined beside the pair of supporting walls 16. The primary wall 11 defines a guiding recess 14. The guiding recess 14 comprises a plurality of arcuate faces continuing one by one along a first direction perpendicular to the periphery wall 12. The primary wall 11 has a plurality of ribs 141 protruding toward the guiding recess 14.

The periphery wall 12 has a pair of latching recesses 15 defined at an outer surface thereof and has a blocking portion 151 formed at a top portion of each latching recess 15.

The connecting member 2 has a copulating portion 21, four protruding portions 23 protruding from four corners of the copulating portion 21 and four latching feet 22 extending downwardly from the protruding portions 23. Each latching feet 22 is formed with a hook portion 221.

The latch 3 comprises a locking portion 32, a neck portion 31 bent from the locking portion 32, a pivot 34 formed at a free end of the neck portion 31. The locking portion 32 has a sliding portion 33 formed at a position adjacent to the neck portion 31. The neck portion 31 has a slit 311 defined at an outer surface thereof The pivot 34 comprises a shaft portion 341 and a plurality of ball portions 342 formed along the shaft portion 341.

The fixing member 5 is formed into a rectangular frame configuration and comprises four blocks 52 and four connecting beams 51 connected with the blocks 52.

The actuator 6 comprises a top wall 61, a plurality of latching beams 62 each having a hook portion 621 and a plurality of the resisting posts 63 extending downwardly from the top wall 61. The top wall 61 has a window 611 defined therein.

The stiffener 7 is formed into a stick configuration. The spring 4 is a compressible coil spring.

Referring to FIGS. 1-6, in assembling of the electrical connector 100, the stiffeners 7 are mounted in the receiving recess 13 of the insulative housing 1 along a second direction parallel to the periphery wall 12 for strengthening the insulative housing 1. The connecting member 2 is mounted in the insulative housing 1, with the latching feet 22 received in the inserting holes 18 and the copulating portion 21 covering on the receiving recess 13. The fixing member 5 is disposed on the connecting member 2, with four blocks 52 abutting against four protruding portions 23 of the connecting member 2 respectively.

The plurality of springs 4 are received in the guiding recesses 14 along an up-to-bottom direction. The latches 3 are mounted in the guiding recesses 14 respectively. The locking portion 32 of the latch 3 is disposed at a locked position and is supported by the platform 17 of the insulative housing 1. The pivot 34 of the latch 3 is restricted in the guiding recess 14, with the ball portions 342 complying with the arcuate faces of the guiding recess 14. The sliding portion 33 of the latch 3 is slidably received in the guiding groove 161 of the supporting wall 16.

Finally, the actuator 6 is moveably mounted on the insulative housing 1, with the latching beams 62 moveably received in the latching recess 15, and the resisting posts 63 inserting into the guiding recess 14 and disposed above the ball portions 342 of the pivot 34.

Figure 6:
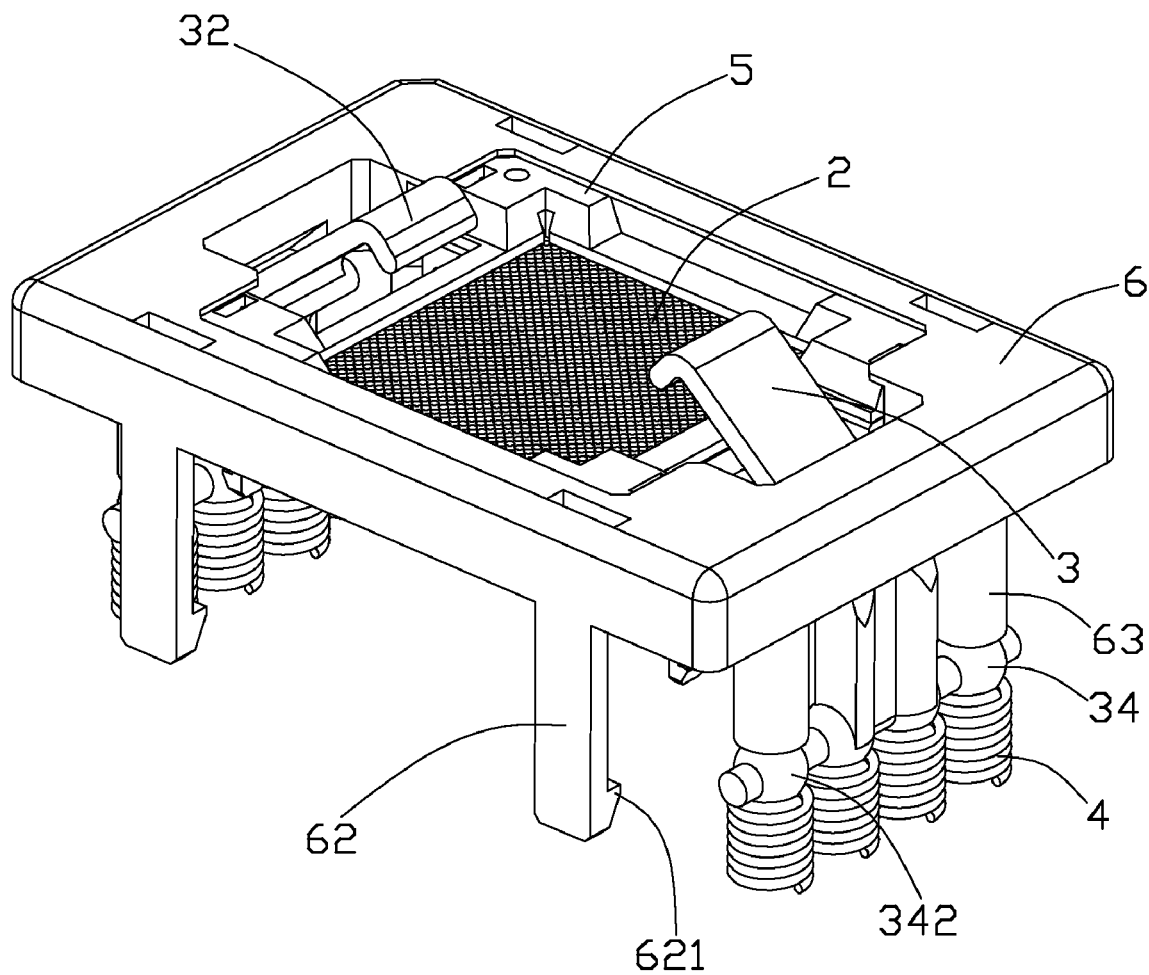
FIG. 6 is a perspective view of the electrical connector disposed in unlocked position, with the insulative housing being removed.
Figure 7:
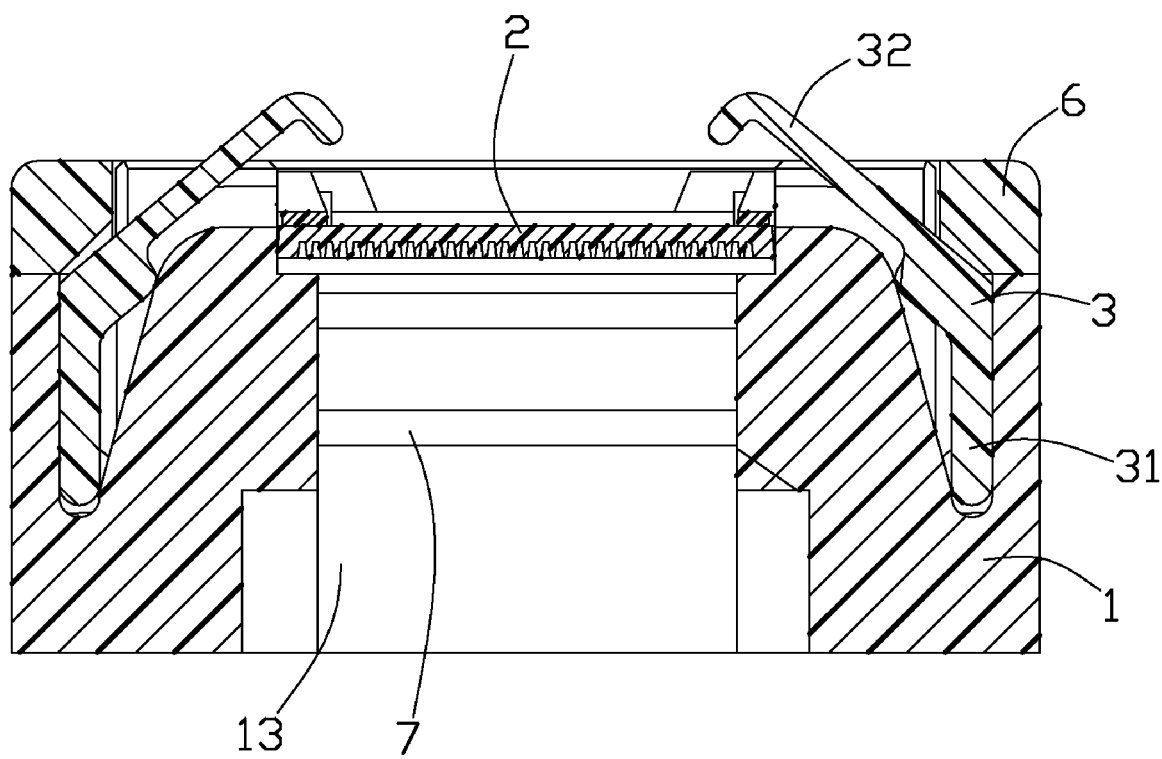
FIG. 7 is a cross-sectional view of the electrical connector disposed in unlocked position, with the actuator being removed, in which the sliding portions are retrieved and the springs are compressed.

Referring to FIGS. 6 and 7, the actuator 6 is pushed downwardly when a force is exerted onto the actuator 6. The ball portions 342 of the pivot 34 are depressed downwardly by the resisting posts 63 of the actuator 6. The ball portions 342 of the latch 3 downwardly depress and compress the springs 4. The latch 3 is pivotable around the pivot 34 from the locked position to an unlocked position. The sliding portions 33 of the latch 3 are slidable along the guiding groove 161 from a first end adjacent to the receiving recess 13 till a second end beyond the receiving recess 13. The rib 141 slides along the slit 311 of the latching member 3. When the latches 3 are disposed at the unlocked position, the chip could be mounted onto the capitulating portion 21 of the connecting member 2.

Figure 5:
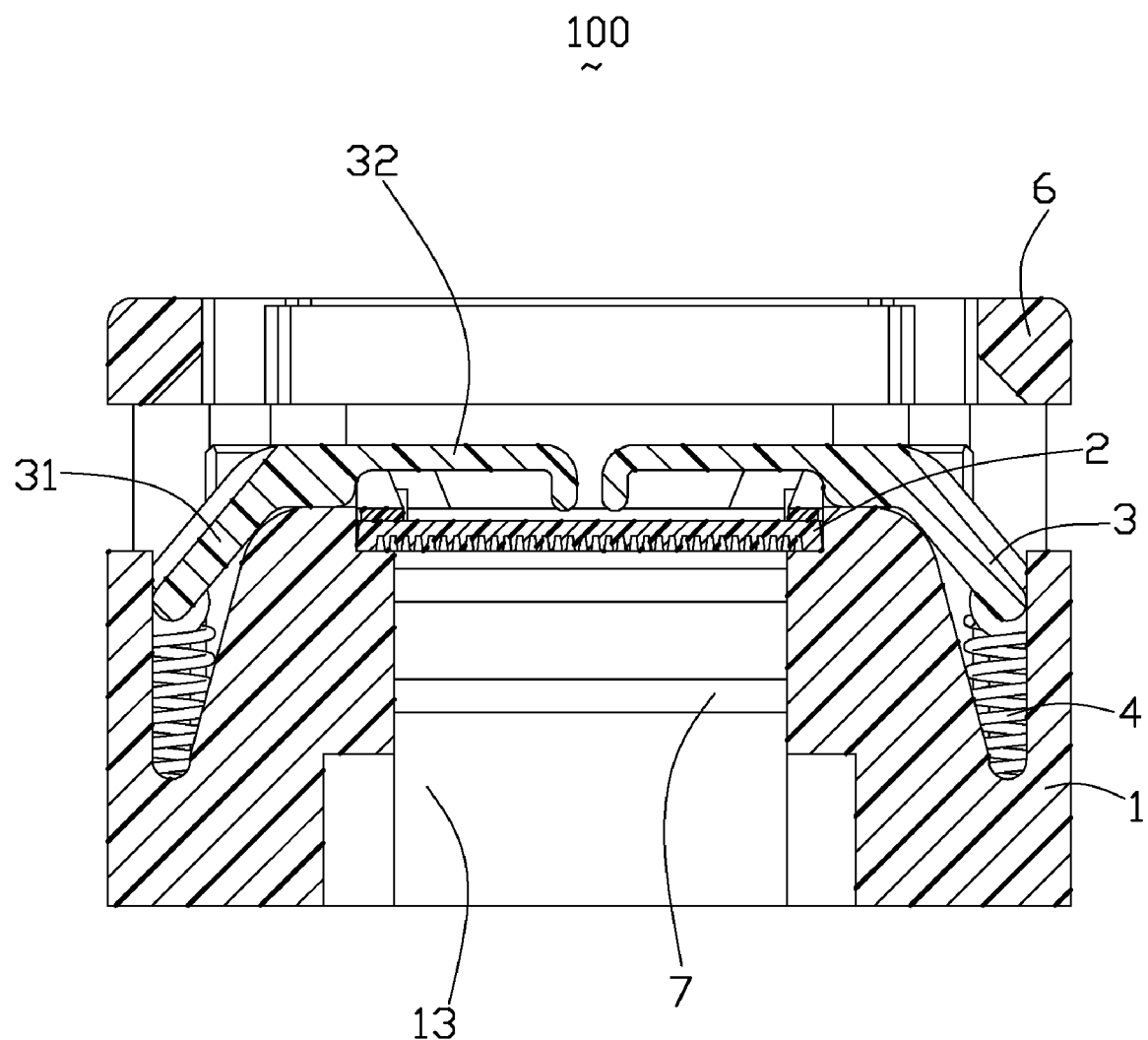
FIG. 5 is a cross-sectional view of the electrical connector, taken along line 5-5 of FIG. 1, and showing the springs fully extended.

Referring to FIG. 5, when the chip is mounted into the electrical connector 100, the actuator 6 is released by removing the exerted force. The springs 4 are restored to the initial position, with the pivot 34 being upwardly raised by the springs 4. The latches 3 are pivotable about the pivot 34 from the unlocked position to the locked position, with the sliding portion 33 sliding from the second end to the first end. The latching beams 62 slide upwardly along the latching recess 15 until the hook portions 621 engaging with corresponding blocking portions 151. The actuator 6 is blocked from dropping off the insulative housing 1, due to the engagement between the hook portions 621 and the blocking portions 151.

The latching members 3 are disposed on the springs 4. The latching members 3 are supported by the springs 4, during the pivotable movement of the latches 3. Therefore, the latching members 3 are capable of achieving a reliable operation due to the support of the springs.

The springs 4 could be formed into other resilient members capable of providing resilient driving force to the latches 3. Since the coil spring 4 has arcuate face engageable with the ball portion 342 of the pivot 34, compared to preferring other resilient members, preferring the coil spring 4 is a better choice. The latching post 63 of the actuator 6 could be formed into other configuration. Since the latching post 63 of the actuator 6 has circular cross-sectional face engageable with the ball portions 342 of the pivot 34, compared to being designed into other configuration, the latching posts 63 being designed into post configuration is a better choice. The pair of latches 3 could be formed into one latch 3, with less locking force could be provided to the chip.

However, the disclosure is illustrative only, changes may be made in detail, especially in matter of shape, size, and arrangement of parts within the principles of the invention.

What is claimed is:

1. An electrical connector for electrically connecting a chip, comprising:
    an insulative housing defining at least one guiding recess;
    a connecting member mounted in the insulative housing for connecting with the chip;
    a plurality of resilient members received in said at least one guiding recess;
    at least one latch having a pivot mounted in the insulative housing and supported by the resilient members; and
    an actuator mounted on the insulative housing and formed with a plurality of latching portions in contact with the latch, said actuator being moveable along an upward and downward direction to drive said at least one latch pivotable about the pivot between a locked position and an unlocked position;
    wherein said at least one guiding recess comprises a pair of guiding recesses, and said at least one latch comprises a pair of latches received in correspond guiding recesses.

2. The electrical connector as claimed in claim 1, wherein said latches are pivotable about the pivot from the locked position to the unlocked position, when the latching portions of the actuator are pushed downwardly to depress the pivot of each latch and compress the resilient members.

3. The electrical connector as claimed in claim 2, wherein said latches are pivotable about the pivot from the unlocked position to the locked position under a resilient force provided by the resilient members, when the actuator is released.

4. The electrical connector as claimed in claim 1, wherein resilient members comprise plural coil springs, and wherein said pivot of each latch comprises a shaft portion and a plurality of ball portions arranged on the shaft portion and supported by the coil springs.

5. The electrical connector as claimed in claim 4, wherein said guiding recess has a plurality of arcuate faces continuing one by one along a first direction parallel to the pivot, for complying with the coil springs and the ball portions of the latch.

6. The electrical connector as claimed in claim 1, wherein each latch comprises a locking portion and a neck portion between the locking portion and the pivot.

7. The electrical connector as claimed in claim 6, wherein said neck portion of the latch is formed with a slit, said guiding recess having a rib protruding toward the guiding recess and slidable along the slit.

8. The electrical connector as claimed in claim 1, wherein said insulative housing comprises a pair of primary walls and a pair of periphery walls, said primary wall being formed with a platform supporting the latch.

9. The electrical connector as claimed in claim 8, wherein said primary wall of the insulative housing is formed with a pair of supporting walls disposed at opposite sides of the platform, each supporting wall defining a guiding groove, said latching member having a pair of sliding portions slidable along the guiding grooves.

10. The electrical connector as claimed in claim 8, wherein said insulative housing defines a receiving recess surrounded by the primary walls and the periphery walls, said electrical connector further comprising a plurality of stiffeners mounted in the receiving recess for strengthening the insulative housing.

11. The electrical connector as claimed in claim 8, wherein said periphery wall of the insulative housing defines a pair of inserting holes, and wherein said connecting member is formed with two pairs of latching feet inserted in the inserting holes.

12. The electrical connector as claimed in claim 11, wherein said connecting member has a capitulating portion connecting with the chip and a plurality of protruding portions connected with the latching feet, and wherein said electrical connector comprises a fixing member having a plurality of blocks secured on the protruding portions of the connecting member.

13. The electrical connector as claimed in claim 8, wherein said periphery wall of the insulative housing defines a pair of latching recesses, and wherein said actuator is formed with a pair of latching beams slidable along the latching recesses.

14. The electrical connector as claimed in claim 13, wherein said latching recess has a blocking portion formed therein, and wherein said latching beam of the actuator is formed with a hook portion engageable with the blocking portion, said actuator being blocked from dropping off the insulative housing due to the engagement between the latching beam and the blocking portion, when the actuator is restored to the locked position.

15. A socket comprising:
a housing defining a flame structure thereof;
an electrical connector disposed in the housing for mating with an electronic package;
a set of compression springs associated with the housing and surrounding the connector;
an actuator mounted upon the housing and moveable up and down in a vertical direction relative to the housing corresponding to said compression springs;
a pair of locking members mounted to the housing, each of said locking members defining a lower section essentially moveable up and down in the vertical direction, and an upper section essentially moveable in and out in a curved manner for holding the electronic package in position in the housing for assuring mating between the connector and the electronic package; and
means for assuring curved movement of the upper section of the locking member with regard to the housing, wherein said means includes a sliding protrusion formed on one of said housing and said locking member, and a sliding groove, for receiving said sliding protrusion, formed in the other of said actuator and the locking member, and said sliding protrusion is essentially located around a middle section of the locking member when said locking member is located at a locked position where the electronic package is locked by said locking member.

16. The socket as claimed in claim 15, wherein said actuator is not directly urged by said springs but via the locking member.

17. The socket as claimed in claim 15, wherein the actuator is urged by the spring via a portion of the lower section of the locking member.

* * * * *